(12) United States Patent
Kawahara et al.

(10) Patent No.: US 9,966,411 B2
(45) Date of Patent: May 8, 2018

(54) METHOD OF MANUFACTURING IMAGE CAPTURING APPARATUS

(71) Applicant: CANON KABUSHIKI KAISHA, Tokyo (JP)

(72) Inventors: Yuki Kawahara, Yokohama (JP); Sho Suzuki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/440,163

(22) Filed: Feb. 23, 2017

(65) Prior Publication Data

US 2017/0263670 A1    Sep. 14, 2017

(30) Foreign Application Priority Data

Mar. 8, 2016  (JP) .................................. 2016-044768

(51) Int. Cl.
*H01L 27/146* (2006.01)

(52) U.S. Cl.
CPC .. *H01L 27/14685* (2013.01); *H01L 27/14621* (2013.01); *H01L 27/14625* (2013.01); *H01L 27/14627* (2013.01); *H01L 27/14636* (2013.01); *H01L 27/14645* (2013.01)

(58) Field of Classification Search
None
See application file for complete search history.

(56) References Cited

U.S. PATENT DOCUMENTS

| 7,599,277 | B1 * | 10/2009 | Kato ...................... | G11B 7/124 369/112.09 |
| 9,570,504 | B2 | 2/2017 | Ogawa et al. | |
| 2008/0164614 | A1 * | 7/2008 | Ito ........................ | H01L 23/5329 257/758 |
| 2012/0202312 | A1 * | 8/2012 | Suzuki .............. | H01L 27/14687 438/73 |
| 2014/0264546 | A1 * | 9/2014 | Lai .................... | H01L 27/11568 257/324 |
| 2015/0277156 | A1 * | 10/2015 | Kondou ................ | G02F 1/2255 385/2 |

FOREIGN PATENT DOCUMENTS

JP    2015-144298 A    8/2015

* cited by examiner

*Primary Examiner* — Jay C Chang
(74) *Attorney, Agent, or Firm* — Fitzpatrick, Cella, Harper & Scinto

(57) ABSTRACT

A method of manufacturing an image capturing apparatus is provided. The method comprises forming a structure which includes an interlayer insulation film having a plurality of opening portions above an imaging and a peripheral region, forming a first film so as to cover the structure arranged above the imaging and the peripheral region while filling the plurality of opening portions, planarizing the first film to form a waveguide member above the imaging and the peripheral region, forming a second film so as to cover the waveguide member above the imaging and the peripheral region after the planarizing the first film, polishing the second film to expose the waveguide member arranged above the imaging region and removing a portion of the waveguide member arranged above the peripheral region so as to expose the interlayer insulation film after the polishing the second film.

14 Claims, 9 Drawing Sheets

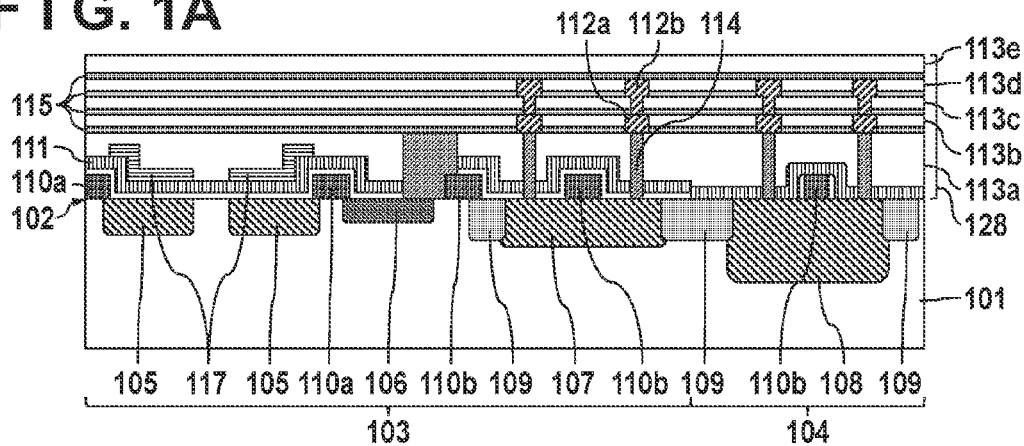
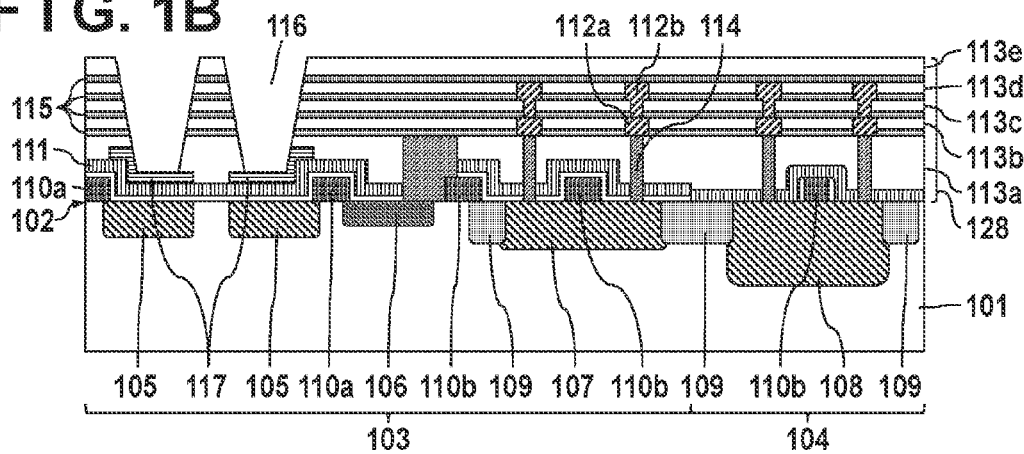
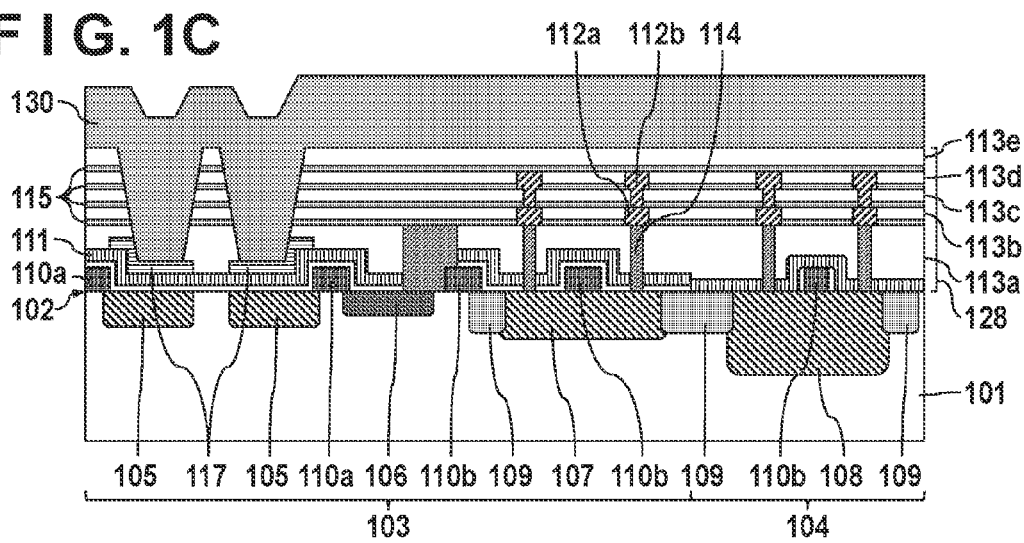

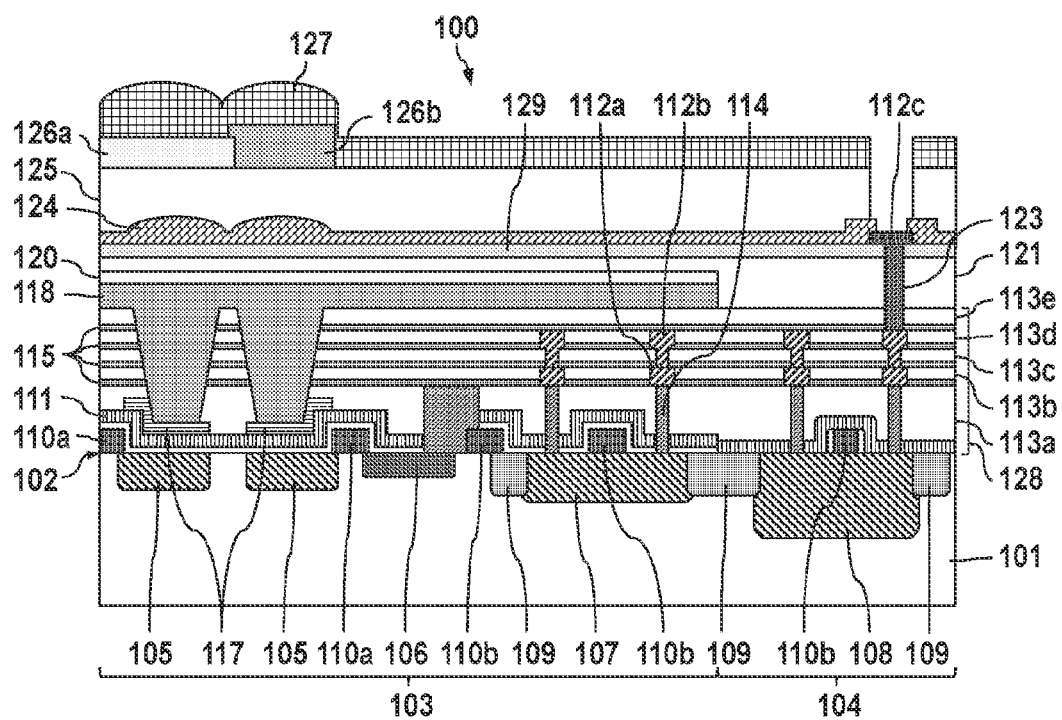
F I G. 2F

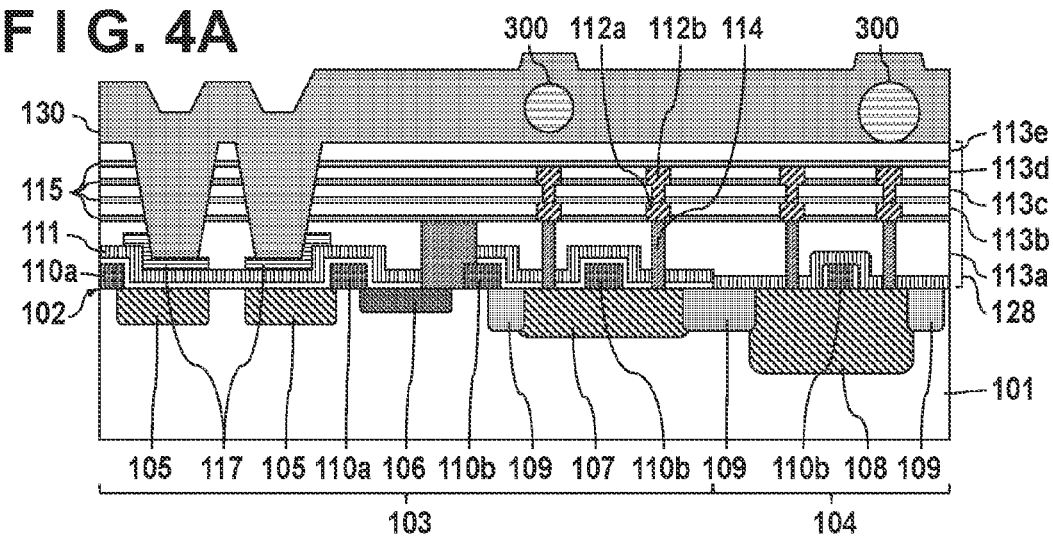
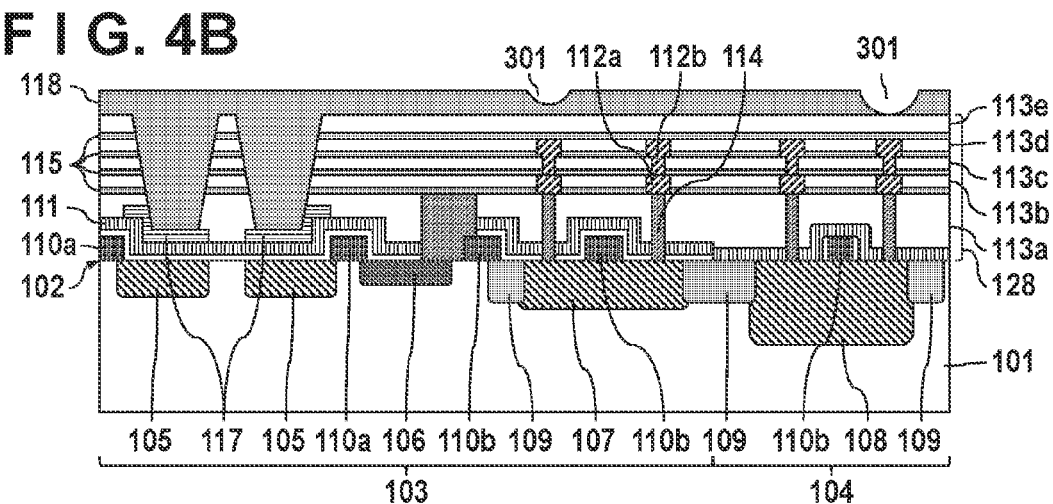
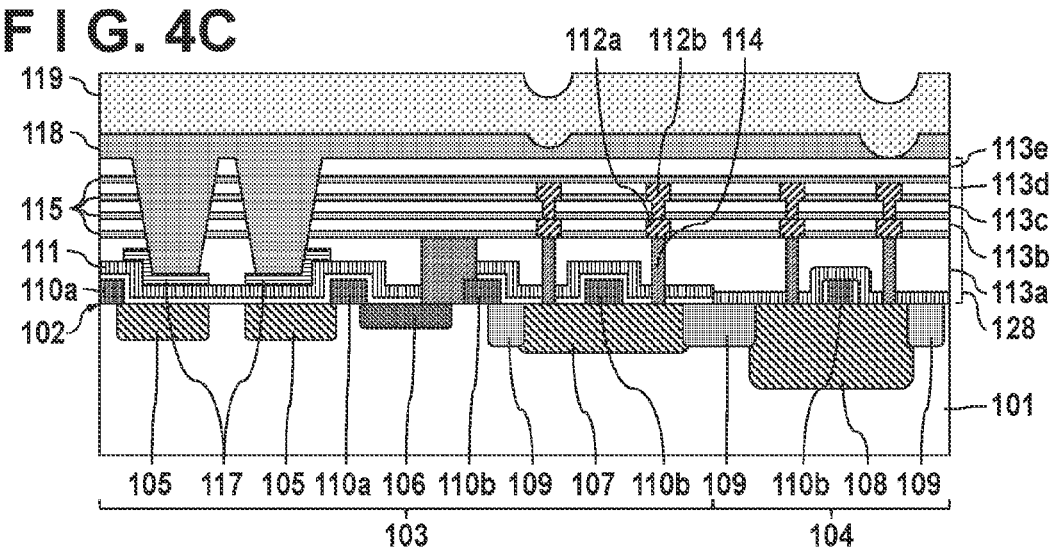

METHOD OF MANUFACTURING IMAGE CAPTURING APPARATUS

BACKGROUND OF THE INVENTION

Field of the Invention

The present invention relates to a method of manufacturing an image capturing apparatus.

Description of the Related Art

There is known an arrangement in which, in an image capturing apparatus, a light waveguide is arranged above a photoelectric conversion unit arranged in an imaging region in order to increase the amount of light entering the photoelectric conversion unit. Japanese Patent Laid-Open No. 2015-144298 describes a manufacturing method of facilitating formation of a contact plug electrically connected to a wiring pattern in a peripheral region which processes a signal output from an imaging region in an image capturing apparatus including a light waveguide. Silicon nitride is deposited as a material for the light waveguide so as to cover an interlayer insulation film such that an opening portion arranged above a photoelectric conversion unit of the interlayer insulation film is embedded. Then, a step generated on the surface of the deposited silicon nitride is planarized by a Chemical Mechanical Polishing (CMP) method to form the light waveguide. After that, a portion of the light waveguide arranged in the peripheral region is removed.

SUMMARY OF THE INVENTION

The present inventors have found that a step of depositing and planarizing a material for a light waveguide has the following problem. When the material for the light waveguide is deposited, a deposit adhering to the inner wall of a processing chamber where deposition is performed may peel off the inner wall and be taken in a deposited material film as foreign particles. If this material film containing the foreign particles is planarized by using a polishing method such as a CMP method, the foreign particles in the material film can be missed by a mechanical external force, generating a defect portion of a concave shape on the surface of the formed light waveguide.

If this defect portion is generated in a portion of the light waveguide above wiring patterns in a peripheral region, an interlayer insulation film arranged below the defect portion may be etched more than another portion when the light waveguide of the portion is removed, exposing the wiring patterns at the end of etching. If the wiring patterns are exposed, the exposed wiring patterns may be etched by a process for removing a resist mask when the portion of the light waveguide arranged in the peripheral region is etched or for removing a byproduct at the time of etching. If the wiring patterns are etched, some of the wiring patterns may disappear, causing conduction errors of the wiring patterns.

Some embodiments of the present invention provide a technique of suppressing a conduction error of a wiring in an image capturing apparatus with a light waveguide.

According to some embodiments, a method of manufacturing an image capturing apparatus, the method comprising: forming, in a substrate, an imaging region in which a plurality of photoelectric conversion units are arranged and a peripheral region for processing signals output from the plurality of photoelectric conversion units; forming a structure which includes, above the imaging region and the peripheral region, an interlayer insulation film having a plurality of opening portions, respectively, arranged above the plurality of photoelectric conversion units and wiring patterns arranged in the interlayer insulation film; forming a first film made of a first material so as to cover the structure arranged above the imaging region and the peripheral region while filling the plurality of opening portions; planarizing the first film to form, above the imaging region and the peripheral region, a waveguide member having an upper surface with a flat surface; forming, above the imaging region and the peripheral region, a second film made of a second material so as to cover the waveguide member after the planarizing the first film; polishing the second film to expose the waveguide member arranged above the imaging region; and removing a portion of the waveguide member arranged above the peripheral region arranged above some of the wiring patterns so as to expose the interlayer insulation film after the polishing the second film, is provided.

Further features of the present invention will become apparent from the following description of exemplary embodiments (with reference to the attached drawings).

BRIEF DESCRIPTION OF THE DRAWINGS

FIGS. 1A to 1F are sectional views showing a method of manufacturing an image capturing apparatus of the present invention;

FIGS. 2A to 2F are sectional views showing the method of manufacturing the image capturing apparatus of the present invention;

FIGS. 4A to 4F are sectional views showing the method of manufacturing the image capturing apparatus of the present invention.

DESCRIPTION OF THE EMBODIMENTS

Figure 1D:
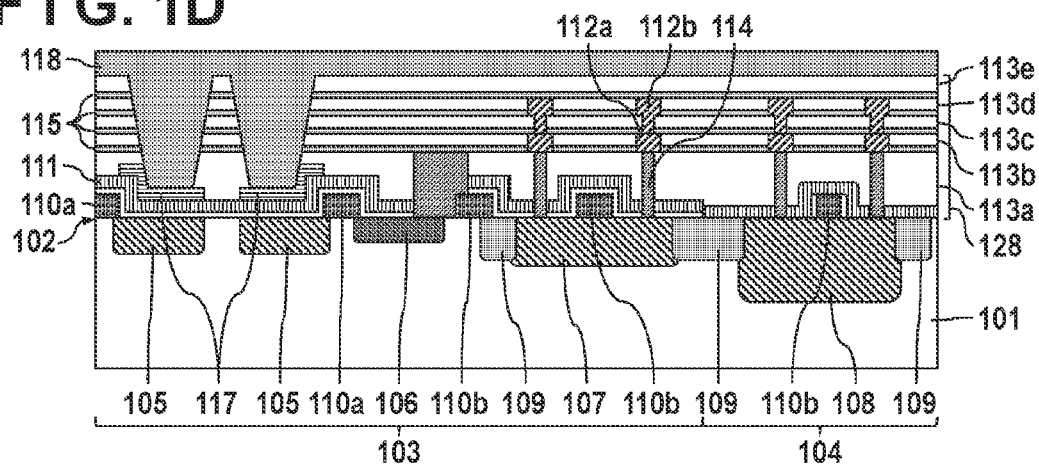

A practical embodiment of an image capturing apparatus of the present invention will be described below with reference to the accompanying drawings. Note that in a description and the drawings below, common reference numerals denote common arrangements throughout the plurality of drawings. Therefore, the common arrangements will be described by referring to the plurality of drawings mutually, and descriptions of the arrangements denoted by the common reference numerals will be omitted as needed.

The structure and a manufacturing method of an image capturing apparatus according to an embodiment of the present invention will be described with reference to FIGS. 1A to 4F. FIGS. 1A to 2F are sectional views showing respective steps in a method of manufacturing an image capturing apparatus 100 according to an embodiment of the present invention.

The image capturing apparatus 100 includes a substrate 101. The substrate 101 can be a portion, made of a semiconductor material, of a member which forms the image capturing apparatus 100. For example, the substrate 101 includes an object with a semiconductor region such as a well formed by a known semiconductor manufacturing process in a semiconductor wafer. For example, silicon, gallium arsenide, or the like can be used as the semiconductor material. The interface between the semiconductor material and another material is a principal surface 102 of the substrate 101. The other material is, for example, silicon oxide arranged in contact with the substrate 101 on the substrate 101.

A known semiconductor substrate can be used for the substrate 101, and silicon is used in this embodiment. P-type semiconductor regions and n-type semiconductor regions are arranged in the substrate 101. In this embodiment, the principal surface 102 can be the interface between the substrate 101 and silicon oxide (not shown) stacked on the substrate 101. The substrate 101 includes an imaging region 103 in which a plurality of photoelectric conversion units 105 are arranged and a peripheral region 104 in which a signal processing circuit for processing signals output from the plurality of photoelectric conversion units 105 is arranged. The imaging region 103 and the peripheral region 104 will be described later.

In this specification, a plane refers to a surface parallel to the principal surface 102. For example, the principal surface 102 in the channel of a MOS transistor or the principal surface 102 in a region where the photoelectric conversion units 105 are arranged to be described later may be used as a reference. A section refers to a surface crossing the plane.

In a step shown in FIG. 1A, the respective semiconductor regions in the substrate 101, a structure 128 including, on the substrate 101, a gate electrode, multilayer wiring patterns, and an interlayer insulation film between the wiring patterns, and the like are formed. In the imaging region 103 of the substrate 101, the photoelectric conversion units 105, a floating diffusion (FD) unit 106, a well 107 for a pixel transistor, source/drain regions in the well 107, and the like are formed. The photoelectric conversion units 105 may be, for example, photodiodes. For example, each photoelectric conversion unit 105 includes the n-type semiconductor region arranged in the p-type semiconductor region of the substrate 101 and forms a p-n junction. Charges generated by photoelectric conversion in accordance with incident light are accumulated in the n-type semiconductor regions of the photoelectric conversion units 105. The FD unit 106 is the n-type semiconductor region arranged in the p-type semiconductor region of the substrate 101. The conductivity types of the respective semiconductor regions may be opposite to each other. The charges generated in the photoelectric conversion units 105 are transferred to the FD unit 106 and converted into a voltage. The FD unit 106 may electrically be connected to the input node of an amplification unit. Also, the FD unit may electrically be connected to a signal output line. In this embodiment, the FD unit 106 is electrically connected to, via contact plugs 114, a gate electrode 110b of an amplification transistor of the amplification unit. The source/drain regions of an amplification transistor which amplifies a signal, a reset transistor which resets the input node of the amplification transistor, and the like are formed in the well 107 for the pixel transistor. A well 108 of a peripheral circuit transistor is formed in the peripheral region 104 of the substrate 101. The source/drain regions of a transistor which forms the signal processing circuit for processing the signals output from the photoelectric conversion units are formed in the well 108. Element isolation portions 109 may also be formed in the substrate 101. The element isolation portions 109 electrically isolate respective elements in the imaging region 103 and the peripheral region 104. The element isolation portions 109 are formed by an element isolation method such as STI (Shallow Trench Isolation) or LOCOS (LOCal Oxidation of Silicon).

In the step shown in FIG. 1A, a transfer gate electrode 110a and the gate electrodes 110b of the respective transistors are formed on the substrate 101. The transfer gate electrode 110a and the gate electrodes 110b are arranged on a gate insulation film (not shown) on the substrate 101. For example, silicon oxide or the like which thermally oxidizes the substrate 101 can be used as the gate insulation film. The transfer gate electrode 110a controls charge transfer between the photoelectric conversion units 105 and the FD unit 106. The gate electrodes 110b control channel regions of the pixel transistor and the peripheral circuit transistor. The imaging region 103 in which the photoelectric conversion units 105 are arranged and the peripheral region 104 for processing the signals output from the photoelectric conversion units 105 are formed including these steps described above.

A protection layer 111 is formed on the substrate 101 after the transfer gate electrode 110a and the gate electrodes 110b are formed. For example, silicon nitride can be used as the protection layer 111. Alternatively, the protection layer 111 may be formed by a plurality of layers containing silicon nitride and silicon oxide. The protection layer 111 may have a function of reducing damage to the photoelectric conversion units 105 in a subsequent step. The protection layer 111 may also have a function of preventing metal diffusion in a silicide step of forming, for example, an electrode which performs electrical connection between the gate electrodes 110b and the source/drain regions.

After the protection layer 111 is formed, etch stop portions 117 are formed on the protection layer 111 arranged above the photoelectric conversion units 105. In an orthogonal projection with respect to the principal surface 102 of the substrate 101, each etch stop portion 117 can be formed to be larger than the bottom of a corresponding one of opening portions 116 formed in order to arrange the light waveguide in the subsequent step. The protection layer 111 and the etch stop portions 117 need not necessarily be formed.

Then, the structure 128 is formed on the imaging region 103 and the peripheral region 104. The structure 128 includes interlayer insulation films 113a to 113e, and a plurality of wiring patterns 112a and 112b arranged in the interlayer insulation films 113a to 113e. The structure 128 may also include the protection layer 111 and the etch stop portions 117 described above as constituent elements. The interlayer insulation films 113a to 113e electrically insulate the wiring patterns 112a and 112b, and the elements arranged on the substrate 101. In this embodiment, the wiring patterns 112a and 112b are formed by using a damascene method. First, the interlayer insulation film 113a is formed above the imaging region 103 and the peripheral region 104. A step generated on the upper surface of the interlayer insulation film 113a may be planarized as needed by using a CMP (Chemical Mechanical Polishing) method or the like. In this specification, the upper surface refers to the surface of each member constituting the image capturing apparatus 100 on a side opposite to the substrate 101. Through holes are formed in the interlayer insulation film 113a. In the through holes, the contact plugs 114 for electrically connecting the wiring patterns 112a to be formed next, and the semiconductor regions formed in the substrate 101, the transfer gate electrode 110a, the gate electrodes 110b, and the like are arranged. The contact plugs 114 are formed by an electrically conductive material, and tungsten or the like is used.

Then, the interlayer insulation film 113b is formed on the upper surface of the interlayer insulation film 113a, and portions of the interlayer insulation film 113b corresponding to regions in which the wiring patterns 112a are arranged are etched and removed. Subsequently, an electrically conductive film made of a metal or the like serving as a material for the wiring patterns 112a is formed above the imaging region 103 and the peripheral region 104. The formed electrically conductive film is removed by polishing it using the CMP method or the like until the upper surface of the interlayer insulation film 113b is exposed. With such a procedure, each wiring pattern 112a is formed into a predetermined pattern.

Subsequently, the interlayer insulation films 113c and 113d are formed above the imaging region 103 and the peripheral region 104. Portions of the formed interlayer insulation film 113d corresponding to regions in which the wiring patterns 112b are arranged are etched and removed. Then, portions of the interlayer insulation film 113c corresponding to regions in which the contact plugs for electrically connecting the wiring patterns 112a and the wiring patterns 112b are arranged are etched and removed. After that, an electrically conductive film made of a metal or the like serving as a material for the wiring patterns 112b and the contact plugs is formed above the imaging region 103 and the peripheral region 104. The formed electrically conductive film is removed by polishing it using the CMP method or the like until the upper surface of the interlayer insulation film 113d is exposed. With such a procedure, each of the wiring patterns 112b and contact plugs is formed into a predetermined pattern. Note that after the interlayer insulation films 113c and 113d are formed, first, the portions of the interlayer insulation films 113c and 113d corresponding to the regions in which the contact plugs for electrically connecting the wiring patterns 112a and the wiring patterns 112b are arranged may be etched and removed. In this case, portions of the interlayer insulation film 113d corresponding to regions in which the wiring patterns 112b are arranged are then etched and removed.

Then, the interlayer insulation film 113e is formed above the imaging region 103 and the peripheral region 104. The upper surface of the interlayer insulation film 113e may be planarized as needed by using the CMP method or the like.

The wiring patterns 112a and 112b may be formed by using a method other than the damascene method. An example of the method other than the damascene method will be described. After the interlayer insulation film 113a is formed, the electrically conductive film serving as the material for the wiring patterns 112a is formed above the imaging region 103 and the peripheral region 104. Then, portions of the electrically conductive film other than the regions in which the wiring patterns 112a are arranged are removed by etching. Consequently, the wiring patterns 112a are obtained. Subsequently, the interlayer insulation films 113b and 113c are formed, and the wiring patterns 112b are formed by using the same method as in forming the wiring patterns 112a. After the wiring patterns 112b are formed, the interlayer insulation films 113d and 113e are formed. The upper surfaces of the interlayer insulation films 113c and 113e may be planarized as needed.

The wiring patterns 112a and 112b are arranged to have different heights with reference to the principal surface 102 of the substrate 101. In this embodiment, copper is used for the wiring patterns 112a and 112b. However, a material other than copper may be used for an electrically conductive member as long as it is the electrically conductive material. The wiring patterns 112a and 112b are insulated from each other by the interlayer insulation film 113c except for portions electrically connected by the contact plugs. In this embodiment, each wiring pattern shows a two-layer arrangement. However, each wiring pattern may be arranged by a single layer, or three or more layers.

An etch stop film used when the wiring patterns 112 are formed, a metal anti-diffusion film of the wiring patterns 112, or a film having the both functions of etch stop and metal anti-diffusion may be formed among the respective interlayer insulation films 113. In this embodiment, silicon oxide is used as a material forming the interlayer insulation films 113a to 113e. Therefore, in this embodiment, an anti-diffusion film 115 having the functions of etch stop and metal anti-diffusion is arranged. For example, silicon nitride can be used for the anti-diffusion film 115. The above-described structure 128 may include this anti-diffusion film 115. The anti-diffusion film 115 may not necessarily be arranged depending on the arrangement of each insulation film or the wiring layer of the structure 128.

Then, as shown in FIG. 1B, the opening portions 116 are formed in portions of the interlayer insulation films 113a and 113e above the photoelectric conversion units 105. If the anti-diffusion film 115 is arranged as in this embodiment, in the orthogonal projection with respect to the principal surface 102, the opening portions 116 are formed in regions of the interlayer insulation films 113a to 113e and the anti-diffusion film 115 corresponding to the photoelectric conversion units 105. In the orthogonal projection with respect to the principal surface 102, it is only necessary that at least some of the opening portions 116 are arranged corresponding to the photoelectric conversion units 105.

In formation of the opening portions 116, first, an etching resist mask (not shown) is formed on the upper surface of the interlayer insulation film 113e. The etching resist mask has openings in a region in which the opening portions 116 are arranged. The etching resist mask can be, for example, a photoresist patterned by a photolithography method.

Subsequently, the interlayer insulation films 113a to 113e and the anti-diffusion film 115 are etched by using the etching resist mask as a mask. Consequently, the opening portions 116 are formed. An etching step of forming the opening portions 116 may perform etching continuously on one condition or may perform etching a plurality of times on different conditions. After the opening portions 116 are formed, the etching resist mask can be removed. With the steps shown in FIGS. 1A and 1B, the structure 128 which includes the interlayer insulation films 113 having the plurality of opening portions 116, respectively, arranged on the plurality of photoelectric conversion units 105 and the wiring patterns 112 arranged in the interlayer insulation films is formed above the imaging region 103 and the peripheral region 104.

If the etch stop portions 117 are arranged as in the arrangement shown in FIG. 1B, etching for forming the opening portions 116 may be performed until the etch stop portions 117 are exposed. A material having a lower etching rate than the interlayer insulation films 113a to 113e can be used for the etch stop portions 117 on an etching condition on which the interlayer insulation films 113a to 113e are etched. If silicon oxide is used for the interlayer insulation films 113a to 113e, silicon nitride or silicon oxynitride can be used as a material for the etch stop portions 117. The etching step of forming the opening portions 116 and exposing the etch stop portions 117 may perform etching continuously on one condition or may perform etching a plurality of times on different conditions.

The opening portions 116 may not necessarily extend through all the interlayer insulation films 113a to 113e. The concave portions of the interlayer insulation films 113a to 113e may be the opening portions 116. The planar shape of each opening portion 116 is, for example, a circular or rectangular loop obtained by closing the boundary of the opening portion 116. Alternatively, the planar shape of each opening portion 116 may be a shape like a trench extending over the corresponding one of the plurality of photoelectric conversion units 105. That is, in this specification, it may be said that the interlayer insulation films 113 have the opening portions 116 if a region in which the interlayer insulation film 113e is not arranged is surrounded or sandwiched by a region in which the interlayer insulation film 113e is arranged in a certain plane.

In this embodiment, in the orthogonal projection with respect to the principal surface 102, the opening portions 116 are formed at positions corresponding to the photoelectric conversion units 105, and no opening portion 116 is formed above the peripheral region 104. However, the opening portions 116 may be formed in the peripheral region 104. In this case, the density of the opening portions 116 formed in the imaging region 103 may be higher than that in the peripheral region 104. The density of the opening portions 116 can be decided by the number of opening portions 116 arranged per unit area. The density of the opening portions 116 can also be decided by the proportion of an area occupied by the opening portions 116.

Then, as shown in FIG. 1C, a waveguide material film 130 using the material forming the light waveguide is formed so as to cover the structure 128 arranged above the imaging region 103 and the peripheral region 104 while filling the plurality of opening portions 116. The waveguide material film 130 is deposited by using, for example, a CVD (Chemical Vapor Deposition) method, a sputtering method, or the like. As shown in FIG. 1C, the waveguide material film 130 includes a portion which embeds each opening portion 116 and functions as the core portion of the light waveguide, and a portion other than the opening portions arranged above the imaging region 103 and the peripheral region 104.

The waveguide material film 130 may be formed continuously on one condition or may be formed by using a plurality of steps on different conditions. For example, a part of the waveguide material film 130 may be formed using a condition on which the adhesion between the waveguide material film 130 and the underlying interlayer insulation films 113a to 113e increases in the first step, and the remaining part of the waveguide material film 130 may be formed on a condition on which the embedding property of each opening portion 116 increases in the following step. Alternatively, the waveguide material film 130 may be formed by forming a plurality of different materials sequentially. In the step of FIG. 1B, if the interlayer insulation films 113a to 113e are etched so as to expose the etch stop portions 117, portions of the waveguide material film 130 each functioning as the light waveguide can be arranged so as to contact a corresponding one of the etch stop portions 117. As shown in FIG. 1C, the waveguide material film 130 may completely fill the opening portions 116. The waveguide material film 130 may partially have a space.

A material having a higher refractive index than the interlayer insulation films 113a to 113e can be used for the material of the waveguide material film 130. If silicon oxide is used for the interlayer insulation films 113a to 113e, the material of the waveguide material film 130 may be silicon nitride. While silicon oxide has the refractive index of about 1.45, silicon nitride has a refractive index of about 2.00. Therefore, based on the Snell's law, light is reflected at the interface between the interlayer insulation films 113a to 113e and the light waveguides formed by portions of the waveguide material film 130 embedded in the opening portions 116. This makes it possible to confine incident light above the photoelectric conversion units 105 inside the light waveguides. If silicon nitride is used for the material of the waveguide material film 130, it is possible to increase the amount of hydrogen contained in silicon nitride in formation. With this hydrogen, the dangling bond of the substrate 101 can be terminated effectively. This makes it possible to reduce noise such as a white spot. The material of the waveguide material film 130 can appropriately be selected in consideration of a trade-off between an advantage in a manufacturing step and optical characteristics such as refractive index differences among the interlayer insulation films 113a to 113e.

The positional relationship between the interlayer insulation films 113a to 113e and the core portions of the light waveguides arranged in the plurality of opening portions 116 will now be described. In a certain plane, regions in which the core portions of the light waveguides are arranged are surrounded or sandwiched by a region in which the interlayer insulation films 113a to 113e are arranged. In other words, in a direction crossing a direction in which the photoelectric conversion units 105 and the core portions of the light waveguides arranged in the opening portions 116 are aligned, the core portions of the light waveguides arranged in the opening portions 116 are aligned. The direction crossing the direction in which the photoelectric conversion units 105 and the core portions of the light waveguides arranged in the opening portions 116 are aligned is, for example, a direction parallel to the principal surface 102 of the substrate 101.

In the orthogonal projection with respect to the principal surface 102, the core portions of the light waveguides arranged in the opening portions 116 are arranged at the positions corresponding to the photoelectric conversion units 105 of the substrate 101. In this embodiment, the refractive index of the waveguide material film 130 forming the core portions of the light waveguides using silicon nitride is higher than those of the interlayer insulation films 113a to 113e using silicon oxide. With such a relationship in refractive index, it is possible to reduce the amount of light leaking to the interlayer insulation films 113a to 113e out of light entering the core portions of the light waveguides above the photoelectric conversion units 105. This makes it possible to increase the amount of the light entering the photoelectric conversion units 105 if at least some of the core portions of the light waveguides arranged in the opening portions 116 are arranged corresponding to the photoelectric conversion units 105 in the orthogonal projection with respect to the principal surface 102.

The refractive index of the waveguide material film 130 forming the light waveguides need not necessarily be higher than those of interlayer insulation films 113a to 113e. For example, if the arrangement is possible in which the light entering the core portions of the light waveguides does not leak to the surrounding interlayer insulation films 113a to 113e, it functions as a light waveguide. For example, a reflecting member such as a metal which reflects light on the side walls of each opening portion 116 may be arranged, and a member which forms the core portion of the light waveguide may be embedded in another portion of the opening portion 116. Further, for example, air gaps may exist between the core portions of the light waveguides arranged in the opening portions 116 and the interlayer insulation films 113a to 113e. The air gaps may be under vacuum or may contain a gas. In this case, the material for the member forming the core portions of the light waveguides and the material for the interlayer insulation films 113a to 113e may have any magnitude relationship in refractive index.

FIG. 1D shows a planarization step of planarizing a step generated on the upper surface of the waveguide material film 130 after the waveguide material film 130 is formed to form a waveguide member 118 having an upper surface with a planarized flat surface above the imaging region 103 and the peripheral region 104. In this embodiment, the upper surface of the waveguide material film 130 is planarized by using the CMP method to form the waveguide member 118 from the waveguide material film 130. This planarization may be performed by using a known method other than the CMP method. Planarization may be performed by, for example, polishing or the like.

In this planarization step, the planarized flat surface of the upper surface of the waveguide member 118 need not be planarized completely as shown in FIG. 1D. It is only necessary to reduce, by the planarization step, the step on the upper surface of the waveguide material film 130 as shown in FIG. 1C before planarization is performed. The film thickness of a portion of the waveguide member 118 arranged in a portion other than the opening portions 116, or a portion contacting the upper surface of the interlayer insulation film 113e at the uppermost position of the structure 128 may be not less than 50 nm and not more than 350 nm.

In this embodiment, the interlayer insulation film 113e arranged above the wiring patterns 112b is formed by silicon oxide as described above. However, the material for the interlayer insulation film 113e of the interlayer insulation films 113a to 113e contacting the waveguide member 118 in the portion other than the opening portions 116 is not limited to silicon oxide. For example, silicon carbide may be used as the interlayer insulation film 113e, and silicon nitride may be deposited on it as the waveguide member 118 (waveguide material film 130). The material for the interlayer insulation film 113e can be anything as long as it has a higher resistivity than the electrically conductive member for the wiring patterns 112b and functions as an insulator. Silicon carbide can have a higher resistivity than the electrically conductive member for the wiring patterns 112b and function as an insulator.

Figure 1E:
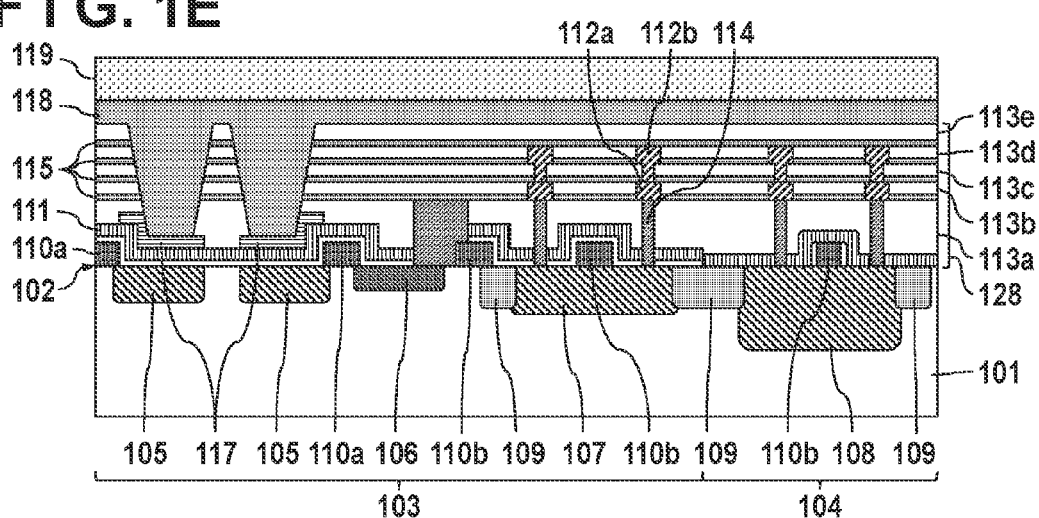

After the waveguide material film 130 is planarized to form the waveguide member 118, a repairing film 119 is formed above the imaging region 103 and the peripheral region 104 so as to cover the waveguide member 118, as shown in FIG. 1E. A material used for the repairing film 119 can be different from the material for the waveguide member 118 (waveguide material film 130). In this embodiment, while silicon nitride is used for the waveguide member 118, silicon oxide is used for the repairing film 119.

Figure 1F:
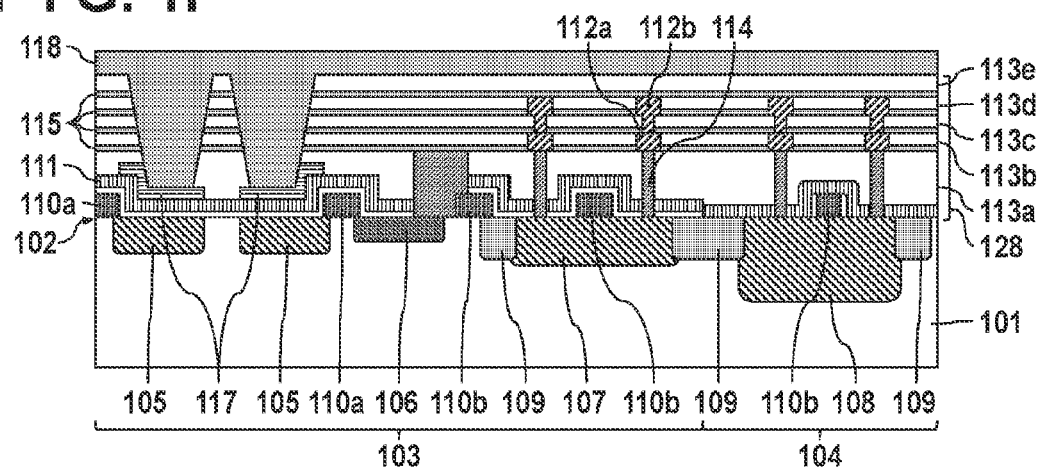

Then, as shown in FIG. 1F, a planarization step of polishing the upper surface of the repairing film 119 by using the CMP method to expose the waveguide member 118 is performed. At this time, the flat surface of the upper surface of the waveguide member 118 planarized in the step shown in FIG. 1D may be exposed, or a portion (surface) of the waveguide member 118 on a side closer to the substrate than the flat surface may be exposed. The repairing film 119 is polished such that at least a portion of the waveguide member 118 arranged above the imaging region 103 is exposed. In this embodiment, the upper surface of the waveguide member 118 arranged above the peripheral region 104 is also exposed, but the repairing film 119 may remain on the waveguide member 118 arranged above the peripheral region 104. The effect of this repairing film 119 will be described later.

Figure 2A:
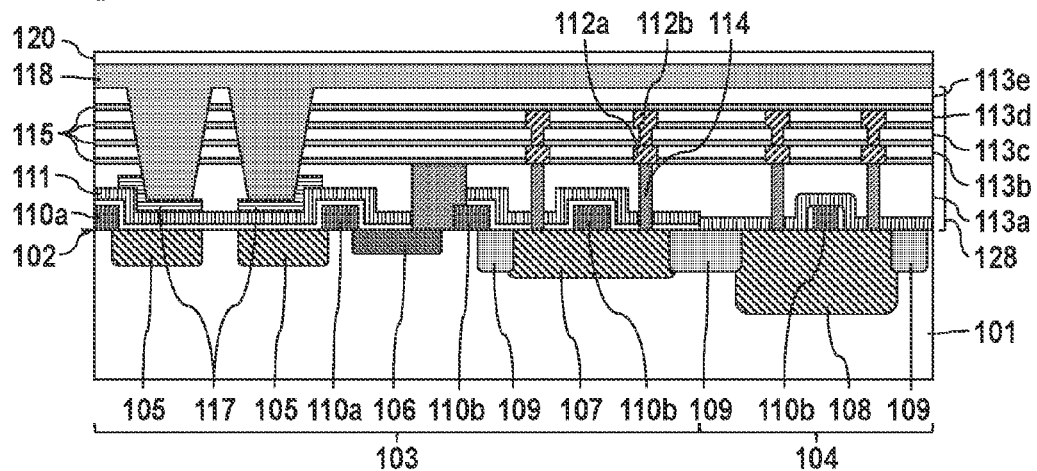

After the repairing film 119 is polished to expose the waveguide member 118 of the imaging region 103, a low refractive index film 120 is formed above the imaging region 103 and the peripheral region 104 so as to cover the waveguide member 118. The low refractive index film 120 can be an insulation film. FIG. 2A shows a state in which the low refractive index film 120 is formed. The refractive index of the low refractive index film 120 is lower than that of a member which is arranged on a side closer to the substrate 101 than the low refractive index film 120 and is arranged in contact with the low refractive index film 120. The member which is arranged on the side closer to the substrate 101 than the low refractive index film 120 and is arranged in contact with the low refractive index film 120 is exposed before the low refractive index film 120 is formed. In this embodiment, the waveguide member 118 corresponds to this member. Hence, in this embodiment, the low refractive index film 120 has the lower refractive index than the waveguide member 118. In this embodiment, the low refractive index film 120 is formed with silicon oxynitride. The refractive index of silicon oxynitride is about 1.72. The low refractive index film 120 may not necessarily be provided. If the low refractive index film 120 is not provided, a step shown in FIG. 2A can be omitted.

Figure 2B:
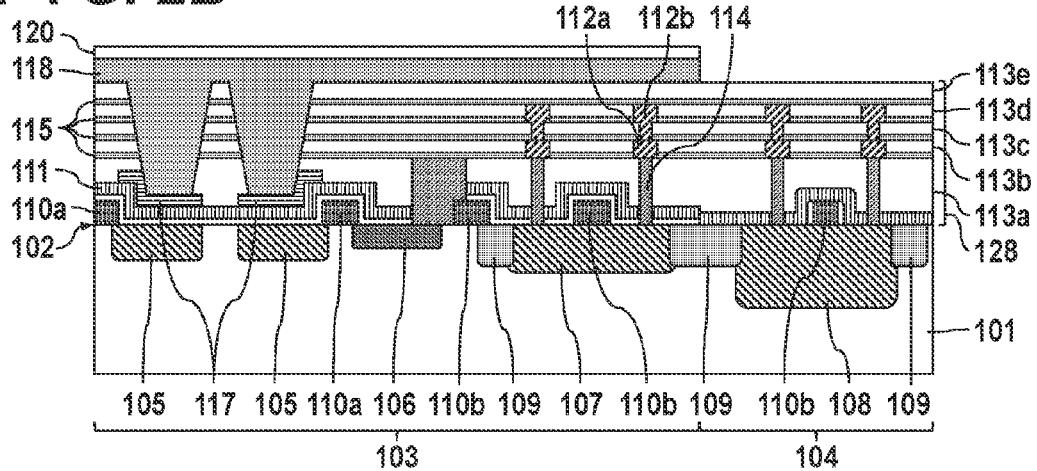

Then, as shown in FIG. 2B, a removal step of removing a region of the waveguide member 118 formed above the peripheral region 104 is performed. In this removal step, portions of the waveguide member 118 arranged above the peripheral region 104 arranged above at least some of the wiring patterns 112b are removed so as to expose the interlayer insulation film 113e. In these portions, contact plugs for electrically connecting the wiring patterns 112b and the outside of the structure 128 are arranged by a step to be described later. As shown in FIG. 2B, the waveguide member 118 formed above the peripheral region 104 may be removed as a whole. Like the arrangement shown in FIG. 2B, if the low refractive index film 120 is arranged on the waveguide member 118, the low refractive index film 120 in the same portions as the waveguide member 118 is also removed.

A known method can be used as a removal method. In this embodiment, a region of the waveguide member 118 and the low refractive index film 120 arranged above the peripheral region 104 is removed by etching. In this removal step, the waveguide member 118 arranged in the imaging region 103 may also be removed partially. At least a portion of the waveguide material film 130 deposited in order to form the core portions of the light waveguides arranged in the opening portions 116 remains, making it possible to increase the amount of the light entering the photoelectric conversion units 105.

The effect of the repairing film 119 used in this embodiment will now be described. FIGS. 3A to 3D are sectional views showing a method of manufacturing an image capturing apparatus of a comparative example. Respective steps of FIGS. 3A to 3D correspond to the steps shown in FIGS. 1C, 1D, 2A, and 2B, respectively, of this embodiment. The image capturing apparatus of the comparative example is different from the image capturing apparatus 100 of this embodiment in that it does not include, in a manufacturing step, a planarization step of forming a repairing film 119 and polishing the repairing film 119 which corresponds to the planarization step of FIGS. 1E and 1F after a planarization step of forming a waveguide member 118.

Figure 3A:
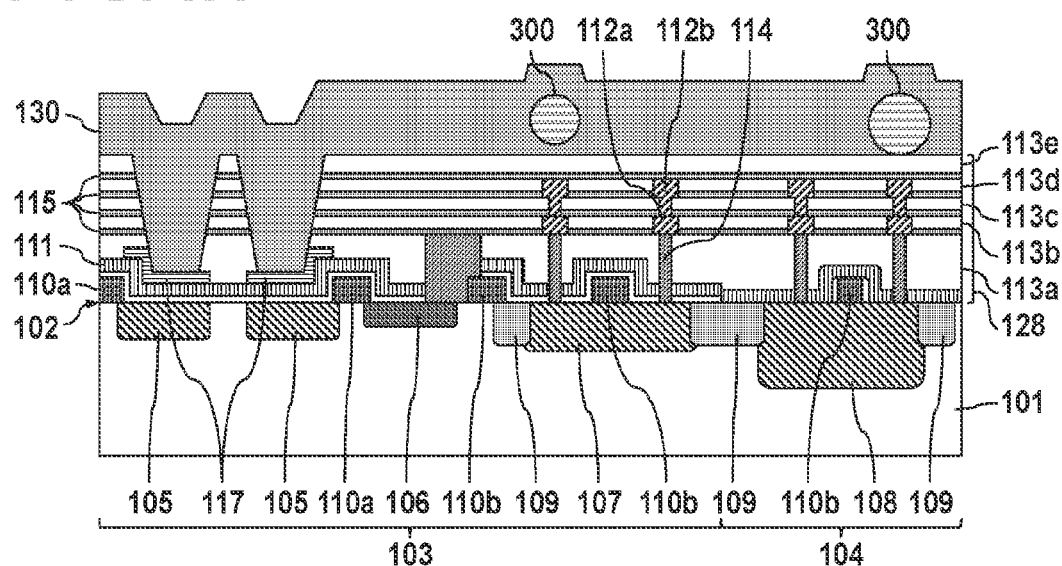
FIGS. 3A to 3D are sectional views showing a method of manufacturing an image capturing apparatus of a comparative example.
Figure 3B:
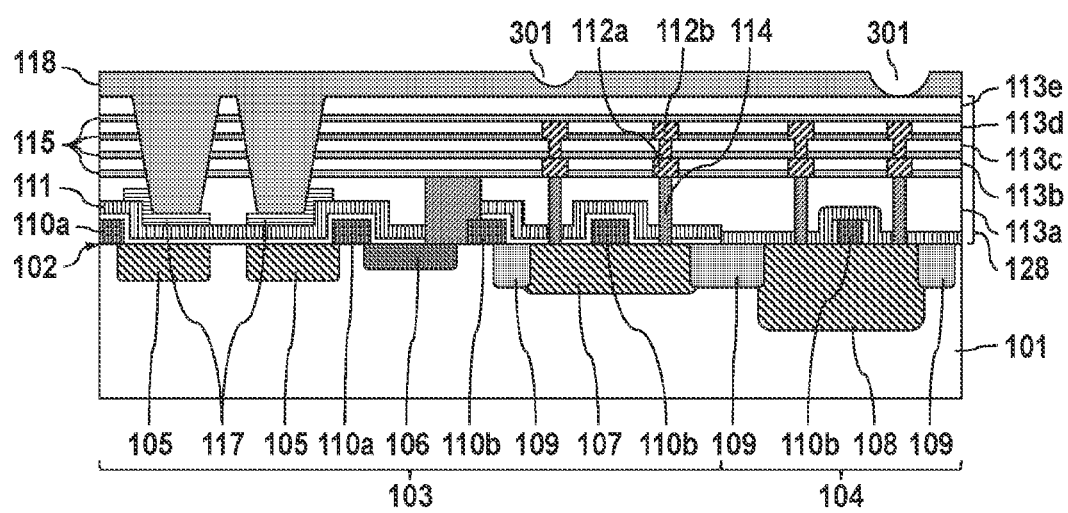
Figure 3C:
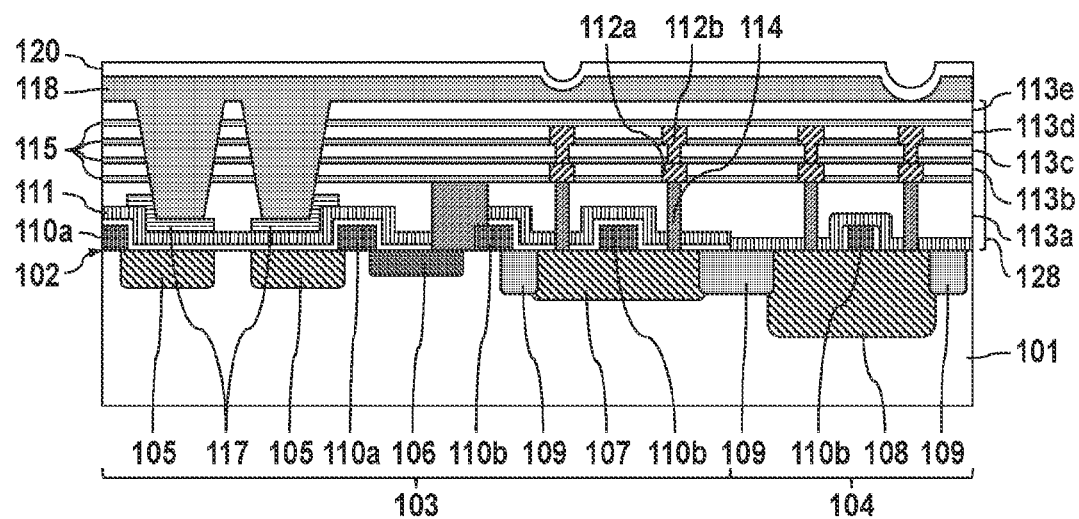
Figure 3D:
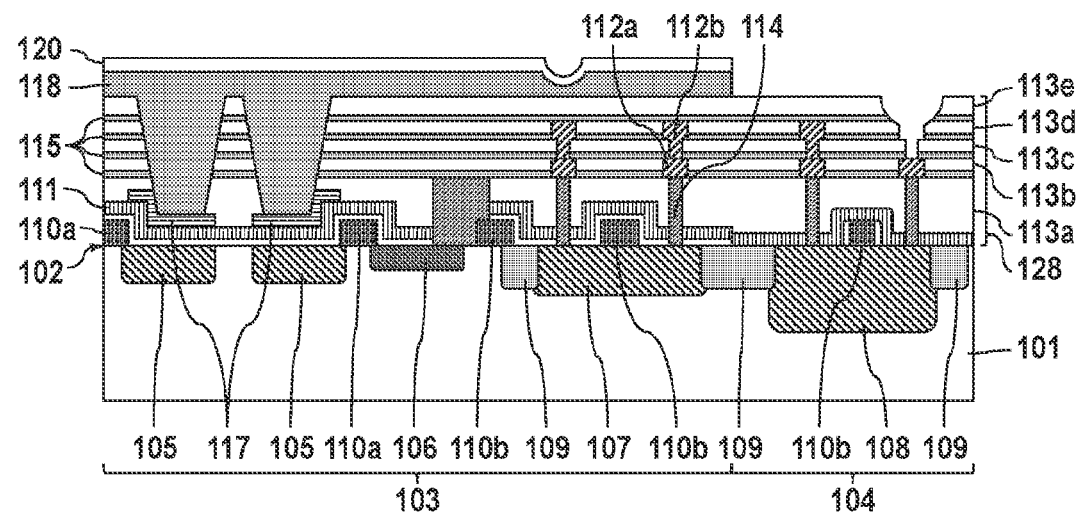

FIG. 3A shows a state in which silicon nitride is deposited as a material for forming the core portions of light waveguides in opening portions 116 to form a waveguide material film 130. The thickness of the waveguide material film 130 to be formed changes depending on the depth of each opening portion 116 when the core portion of the light waveguide is formed. For example, the height of the core portion of each light waveguide to be formed increases as the depth of the opening portion 116 increases, becoming necessary to form the waveguide material film 130 having a larger thickness. It is known that as a film deposited by a CVD method, a sputtering method, or the like becomes thicker, a stress increases. This allows a deposit adhering to the inner wall of a processing chamber of a manufacturing apparatus when the waveguide material film 130 is deposited to easily peel off a wall portion as a film thickness increases. If the deposit peels off the inner wall of the processing chamber while depositing the waveguide material film 130, the peeled deposit may be taken in the film of the waveguide material film 130 as foreign particles 300. FIG. 3A shows the waveguide material film 130 containing the foreign particles 300. If the waveguide material film 130 contains the foreign particles 300, the foreign particles 300 may be missed by a mechanical external force in polishing in a step of planarizing the waveguide material film 130 to form the waveguide member 118 shown in FIG. 3B. If the foreign particles 300 are missed, defect portions 301 each having a concave shape are generated on the upper surface of the planarized waveguide member 118. Then, as shown in FIG. 3C, a low refractive index film 120 is formed without forming the repairing film 119. After the low refractive index film 120 is formed, a removal step of removing a portion of the waveguide member 118 and the low refractive index film 120 formed above a peripheral region 104 is performed. In this removal step, if a difference in etching rate between the waveguide member 118, and an interlayer insulation film 113e and an anti-diffusion film 115 is small, the interlayer insulation film 113e and the anti-diffusion film 115 in portions below the defect portions 301 may be removed by etching. Consequently, some of wiring patterns 112b may be exposed. If the wiring patterns 112b are exposed, the wiring patterns 112b may be etched together with the waveguide member 118 and the low refractive index film 120 in the removal step of the waveguide member 118 and the low refractive index film 120. After the removal step, the wiring patterns 112b may also be etched by a process for removing a resist mask when a portion of the waveguide member 118 arranged above the peripheral region 104 is etched or for removing a byproduct at the time of etching. If the wiring patterns 112b is etched, and some of the wiring patterns 112b disappear, conduction errors may occur. FIG. 3D shows a state in which some of the wiring patterns 112b disappear by a removal process of the resist mask or the byproduct.

Figure 4D:
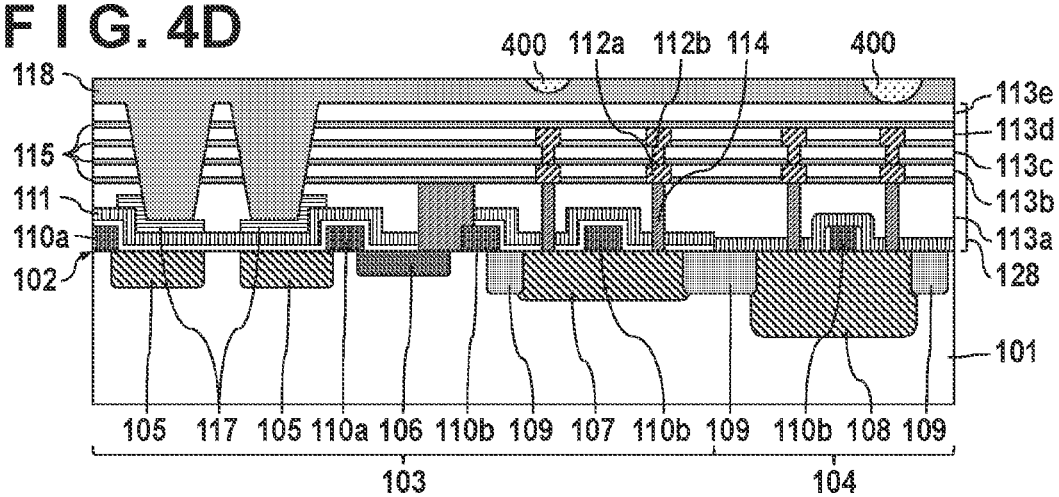

Meanwhile, in this embodiment, the repairing film 119 is used in order to suppress the conduction errors caused by the disappearance of the wiring patterns 112b. FIGS. 4A to 4F show a manufacturing method used if the waveguide material film 130 contains the foreign particles 300. FIGS. 4A to 4F, respectively, correspond to the steps shown in FIGS. 1C to 1F, and FIGS. 2A and 2B. Respective steps shown in FIGS. 4A and 4B are the same as the steps shown in FIGS. 3A and 3B described above. After the upper surface of the waveguide material film 130 is planarized to form the waveguide member 118, the repairing film 119 is formed so as to cover the upper surface of the waveguide member 118 on which the defect portions 301 each having the concave shape are generated, as shown in FIG. 4C. In the step of forming this repairing film 119, a part of the repairing film 119 is embedded in the defect portions 301. The defect portions 301 may completely be embedded by the part of the repairing film 119 or may have spaces. The thickness of the repairing film 119 formed at this time may be formed larger than the film thickness of a portion of the waveguide member 118 arranged in a portion other than the opening portions 116 before the repairing film 119 is formed. By making the thickness of the repairing film 119 larger than the thickness of the portion of the waveguide member 118 arranged in the portion other than the opening portions, the repairing film 119 is embedded in the defect portions 301 easily even if the defect portions 301 reaching the interlayer insulation film 113e are generated in the waveguide member 118.

Then, the repairing film 119 is polished by using the CMP method so as to expose at least the waveguide member 118 arranged above an imaging region 103. Repairing portions 400 obtained by embedding the part of the repairing film 119 in the defect portions 301 generated on the upper surface of the waveguide member 118 are formed by a planarization step of polishing this repairing film 119 to expose the waveguide member 118. In the arrangement shown in FIG. 4D, an example is shown in which the repaired upper surface of the waveguide member 118 and the repairing portions 400 embedded in the defect portions 301 become flat. However, they need not necessarily be flat. It is only necessary to, for example, relax the concave shape of each defect portion 301.

Figure 4E:
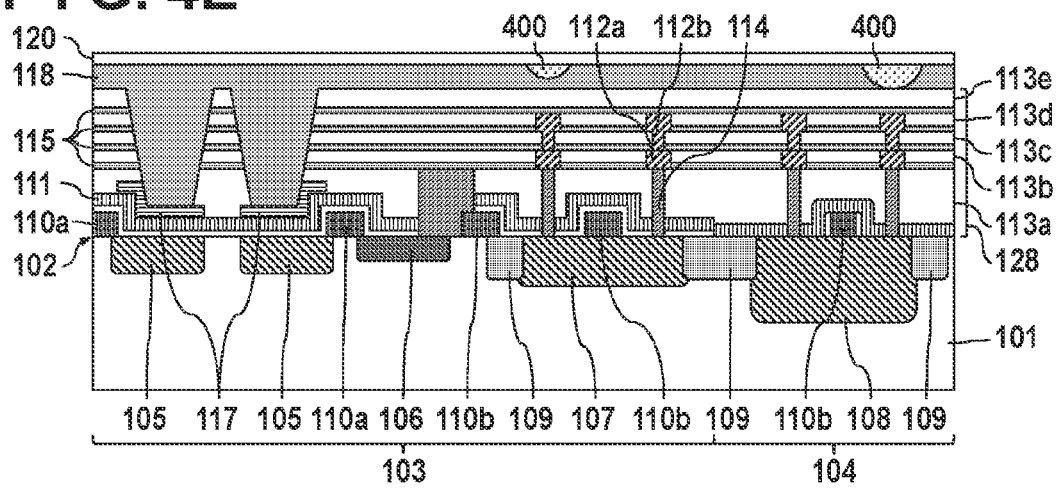
Figure 4F:
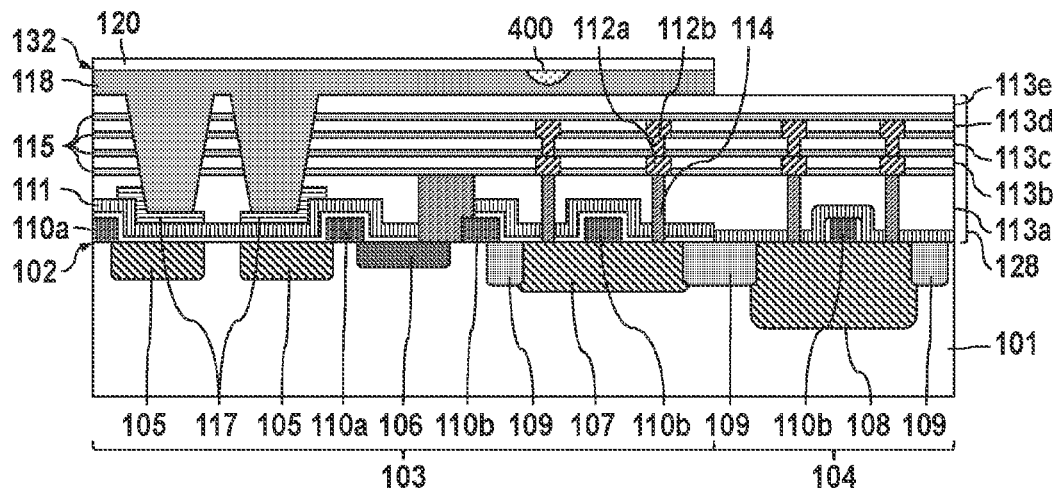

Then, the low refractive index film 120 is formed as shown in FIG. 4E. After the low refractive index film 120 is formed, a removal step of removing, by etching, a region of the waveguide member 118 and the low refractive index film 120 formed above the peripheral region 104 is performed. Unlike the step of FIG. 3D described above, in this removal step, the repairing portions 400 repair the defect portions 301, restraining a portion of the interlayer insulation film 113e below the defect portions 301 from being removed greatly as compared with another portion. Subsequently, the process for removing the resist mask when the waveguide member 118 is etched or for removing the byproduct at the time of etching is performed. FIG. 4F shows a state after the process. It becomes difficult to remove the portion of the interlayer insulation film 113e below the defect portions 301, suppressing exposure of the wiring patterns 112b and the disappearance of the wiring patterns 112b. The conduction errors of wiring patterns 112 are suppressed by using the repairing film 119. The repairing portions 400 filling the defect portions 301 may remain above the imaging region 103 and the peripheral region 104.

Figure 2C:
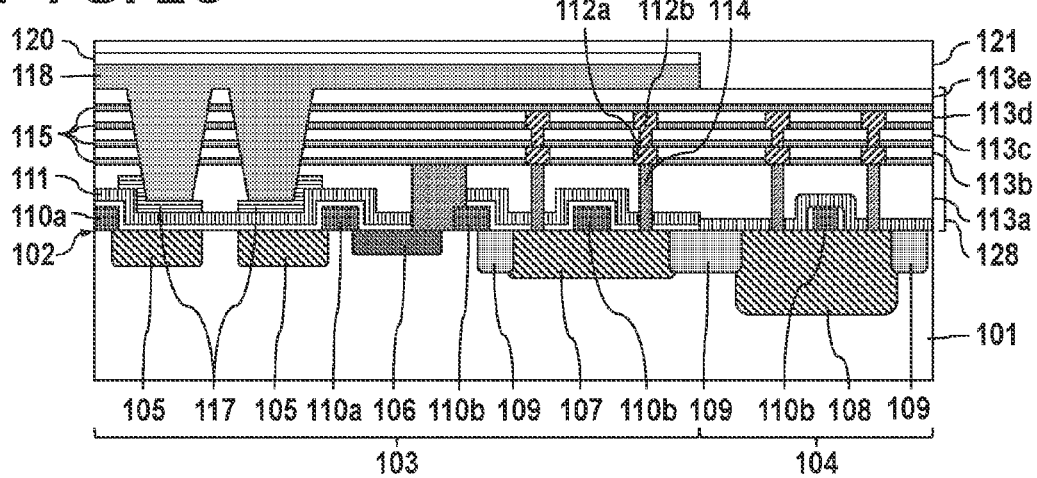

After a portion of the waveguide member 118 and the low refractive index film 120 formed above the peripheral region 104 is removed by etching, an interlayer film 121 is formed so as to cover the waveguide member 118, the low refractive index film 120, and the interlayer insulation film 113e as shown in FIG. 2C. The interlayer film 121 is formed above the imaging region 103 and the peripheral region 104. The interlayer film 121 may be formed by the same material as the interlayer insulation film 113e. The upper surface of the interlayer film 121 can be planarized as needed.

Figure 2D:
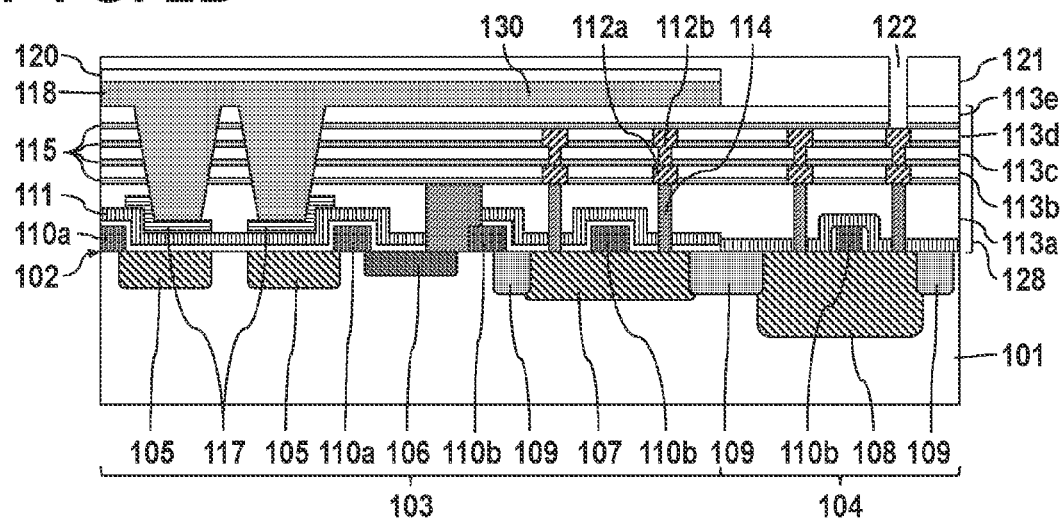

After the interlayer film 121 is formed, a through hole 122 is formed at a position corresponding to a predetermined portion of the wiring pattern 112b in the interlayer film 121 as shown in FIG. 2D. The through hole 122 is formed by, for example, etching the interlayer film 121 and the interlayer insulation film 113e.

Figure 2E:
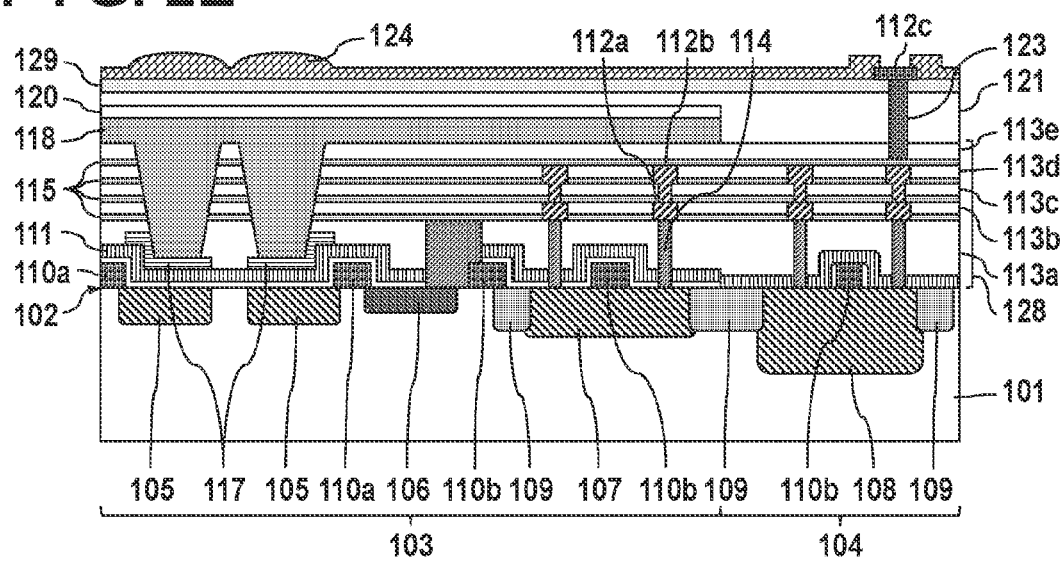

Then, a wiring pattern 112c and intralayer lenses 124 are formed by the step shown in FIG. 2E. First, a contact plug 123 is formed in the through hole 122. The contact plug 123 electrically connects the predetermined portion of the wiring pattern 112b and a predetermined portion of the wiring pattern 112c arranged outside a structure 128 after the contact plug 123 is formed. For example, tungsten is used for the contact plug 123. A material forming the contact plug 123 is not limited to tungsten but can be an electrically conductive material.

Then, the wiring pattern 112c is formed. In this embodiment, aluminum is used for the wiring pattern 112c. The method described above in the step of forming the wiring patterns 112a and 112b is used appropriately for a method of forming the wiring pattern 112c. A material for the wiring pattern 112c is not limited to aluminum but can be an electrically conductive material.

In this step, the plurality of intralayer lenses 124 are also formed. Each of the intralayer lenses 124 is arranged corresponding to each of a plurality of photoelectric conversion units 105. The intralayer lenses 124 are formed with, for example, silicon nitride. A known method can be used for a method of forming the intralayer lenses 124. In the arrangement shown in FIG. 2E, a material forming the intralayer lenses 124 is also arranged in the peripheral region 104. However, the material forming the intralayer lenses 124 may be arranged only in the imaging region 103.

An intermediate film 129 having a refractive index intermediate between those of the intralayer lenses 124 and the interlayer film 121 may also be arranged between them. In this embodiment, the intermediate film 129 using silicon oxynitride is arranged between the intralayer lenses 124 and the interlayer film 121. The refractive indexes of silicon nitride used for the intralayer lenses 124 is about 2.00, silicon oxynitride used for the intermediate film 129 is about 1.72, and silicon oxide used for the interlayer film 121 is about 1.45. A reflectance can be reduced by having such an arrangement.

The effect of the intermediate film 129 will be described briefly. In general, when light travels from a medium having a refractive index n1 to a medium having a refractive index n2, the reflectance increases as the difference between n1 and n2 is larger. A difference in refractive index at the interface becomes smaller by arranging, between the intralayer lenses 124 and the interlayer film 121, the intermediate film 129 having the refractive index intermediate between them. As a result, a reflectance obtained when light enters the interlayer film 121 from the intralayer lenses 124 can be made smaller than in a case in which the intralayer lenses 124 and the interlayer film 121 are arranged in contact with each other. Similarly, the difference in refractive index at the interface becomes smaller by arranging, between the interlayer film 121 and the waveguide member 118, the low refractive index film 120 having the refractive index intermediate between them. As a result, a reflectance obtained when light enters, from the interlayer film 121, the core portions of the light waveguides formed by the waveguide member 118 can be made smaller.

The degree of a reduction in the reflectance obtained by arranging the intermediate film 129 changes depending on the relationship among a thickness d of the intermediate film 129, a refractive index N, and a wavelength p of incident light. This is because multiple reflected light beams from a plurality of interfaces cancel each other. Theoretically, if k is an arbitrary integer equal to or larger than 0, the reflectance is reduced the most on a condition given by:

$$d = \frac{p}{4N}(2k+1) \quad (1)$$

That is, theoretically, the reflectance is reduced the most if the film thickness of an intermediate member is an odd multiple of p/4N. Therefore, the film thickness of the intermediate member can be set based on equation (1) described above. In particular, the film thickness of the intermediate member may satisfy:

$$\frac{p}{4N}(2k+0.5) < d < \frac{p}{4N}(2k+1.5) \quad (2)$$

Further, it may be k=0 in inequality (2).

A case will be considered in which, for example, the refractive index of the interlayer film 121 is 1.45, the refractive index of the intermediate film 129 is 1.72, the refractive index of each intralayer lens 124 is 2.00, and the wavelength of light entering an image capturing apparatus 100 is 550 nm. In this case, assuming that the thickness of the intermediate film 129 is 80 nm, the transmittance of light transmitted from the intralayer lenses 124 to the interlayer film 121 is about 1.00. In contrast, the transmittance is about 0.97 if the intralayer lenses 124 and the interlayer film 121 are arranged in contact with each other.

After the intralayer lenses 124 are formed, color filters 126a and 126b, and microlenses 127 are formed by the step shown in FIG. 2F. First, an interlayer film 125 is formed on the intralayer lenses 124. The interlayer film 125 is, for example, an insulation film formed by an organic material. The upper surface of the interlayer film 125 is planarized as needed. The interlayer film 125 having the planarized upper surface can be formed by, for example, applying the organic material which forms the interlayer film 125.

Then, the color filters 126a and 126b are formed. The color filters 126a and 126b are, respectively, arranged in correspondence to the photoelectric conversion units 105. Light transmitted through the color filter 126a and light transmitted through the color filter 126b may be different from each other in wavelength. Subsequently, the microlenses 127 are formed on the color filters 126a and 126b. A known method can be used for a method of forming the microlenses 127.

The image capturing apparatus 100 according to this embodiment is manufactured by the steps shown in FIGS. 1A to 1F, FIGS. 2A to 2F, and FIGS. 4A to 4F described above. It becomes possible, by using the repairing film 119, to suppress the conduction errors caused in the wiring patterns 112b and to increase the manufacturing yield of the image capturing apparatus 100.

The embodiment of the present invention has been described above. However, the present invention is not limited to this embodiment. The above-described embodiment can appropriately be modified and combined without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-044768, filed Mar. 8, 2016, which is hereby incorporated by reference wherein in its entirety.

What is claimed is:

1. A method of manufacturing an image capturing apparatus, the method comprising:

forming, in a substrate, an imaging region in which a plurality of photoelectric conversion units are arranged and a peripheral region for processing signals output from the plurality of photoelectric conversion units;

forming, above the imaging region and the peripheral region, a structure which includes an interlayer insulation film having a plurality of opening portions, respectively, arranged above the plurality of photoelectric conversion units and wiring patterns arranged in the interlayer insulation film;

forming a first film so as to cover the structure arranged above the imaging region and the peripheral region while filling the plurality of opening portions;

planarizing the first film to form, above the imaging region and the peripheral region, a waveguide member having an upper surface with a flat surface;

forming, above the imaging region and the peripheral region, a second film so as to cover the waveguide member after the planarizing the first film;

polishing the second film to expose the waveguide member arranged above the imaging region; and removing a portion of the waveguide member arranged above the peripheral region arranged above some of the wiring patterns so as to expose the interlayer insulation film after the polishing the second film, wherein in the planarizing the first film, a defect portion of a concave shape is generated on the upper surface of the waveguide member, and wherein in the forming the second film, a part of the second film is embedded in the defect portion.

2. The method according to claim 1, wherein after the polishing the second film, the part of the second film is embedded in the defect portion of the upper surface of the waveguide member.

3. The method according to claim 1, wherein a thickness of the second film before the polishing the second film is larger than a film thickness of a portion of the waveguide member arranged in a portion other than the plurality of opening portions.

4. The method according to claim 1, wherein the first film is made of a first material containing silicon nitride.

5. The method according to claim 1, wherein the first film and the second film are made of different materials from each other.

6. The method according to claim 1, wherein the second film is made of a second material containing silicon oxide.

7. The method according to claim 1, wherein the interlayer insulation film contains silicon oxide.

8. The method according to claim 1, wherein a portion of the interlayer insulation film in contact with the waveguide member in a portion other than the plurality of opening portions contains silicon carbide, and another portion contains silicon oxide.

9. The method according to claim 1, further comprising, between the polishing the second film and the removing the portion of the waveguide member, forming, above the imaging region and the peripheral region, a third film having a lower refractive index than the first film so as to cover the waveguide member.

10. The method according to claim 9, wherein the third film contains silicon oxynitride.

11. The method according to claim 1, wherein the planarizing the first film includes planarization using Chemical Mechanical Polishing.

12. The method according to claim 1, wherein the polishing the second film includes planarization using Chemical Mechanical Polishing.

13. The method according to claim 1, wherein a film thickness of a portion of the waveguide member arranged in a portion other than the plurality of opening portions is 50 nm to 350 nm.

14. The method according to claim 1, wherein the defect portion is a deposit peeled off an inner wall of a processing chamber and taken into the first film, and wherein the deposit is removed during the planarizing the first film.

* * * * *